United States Patent
Wang (10) Patent No.: US 12,133,347 B2
(45) Date of Patent: Oct. 29, 2024

(54) FLEXIBLE DISPLAY MODULE AND MOBILE TERMINAL

(71) Applicant: Wuhan China Star Optoelectronics Semiconductor Display Technology Co., Ltd., Wuhan (CN)

(72) Inventor: Wenqiang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/619,668

(22) PCT Filed: Nov. 3, 2021

(86) PCT No.: PCT/CN2021/128429
§ 371 (c)(1),
(2) Date: Dec. 16, 2021

(87) PCT Pub. No.: WO2023/065403
PCT Pub. Date: Apr. 27, 2023

(65) Prior Publication Data
US 2024/0179863 A1 May 30, 2024

(30) Foreign Application Priority Data
Oct. 20, 2021 (CN) .......................... 202111219847.5

(51) Int. Cl.
*H05K 5/04* (2006.01)
*G06F 1/16* (2006.01)
*H05K 7/20* (2006.01)
(52) U.S. Cl.
CPC ............ *H05K 5/04* (2013.01); *G06F 1/1652* (2013.01); *H05K 7/20963* (2013.01)

(58) Field of Classification Search
CPC .... H05K 5/04; H05K 7/20963; G06F 1/1652; H04M 1/0222; H04M 1/0268
See application file for complete search history.

(56) References Cited

U.S. PATENT DOCUMENTS 11,662,780 B2 * 5/2023 Park ...................... G06F 1/1616
361/679.01
2017/0188463 A1 6/2017 Kim
(Continued)

FOREIGN PATENT DOCUMENTS

CN 207134070 U 3/2018
CN 110689813 A 1/2020
(Continued)

OTHER PUBLICATIONS

International Search Report in International application No. PCT/CN2021/128429,mailed on Jun. 28, 2022.
(Continued)

*Primary Examiner* — Sagar Shrestha
(74) *Attorney, Agent, or Firm* — PV IP PC; Wei Te Chung (57) ABSTRACT

A flexible display module and a mobile terminal are disclosed. The flexible display module includes a first bending region, a second bending region and at least one bidirectional bending region located at an overlap position between the first bending region and the second bending region, wherein the flexible display module includes a support layer, and the support layer includes a cut-out structure at least disposed in the bidirectional bending region. The cut-out structure includes multiple cut-out holes. The cut-out hole includes a long axis and a short axis arranged in a cross manner.

18 Claims, 6 Drawing Sheets

(56) References Cited

U.S. PATENT DOCUMENTS

| | | | |
|---|---|---|---|
| 2018/0097197 A1* | 4/2018 | Han | H05K 5/03 |
| 2019/0165311 A1 | 5/2019 | Lee | |
| 2020/0146165 A1* | 5/2020 | Zuo | H05K 5/0017 |
| 2020/0357325 A1 | 11/2020 | Zhao | |
| 2021/0118337 A1* | 4/2021 | Park | G09F 9/301 |
| 2021/0151697 A1* | 5/2021 | Cao | H10K 50/841 |
| 2021/0153363 A1 | 5/2021 | Cao | |
| 2021/0165454 A1* | 6/2021 | Dong | G06F 1/1652 |
| 2021/0257582 A1* | 8/2021 | Kim | B32B 7/02 |
| 2022/0103672 A1* | 3/2022 | Jung | G02F 1/133331 |
| 2022/0199922 A1* | 6/2022 | Choi | H10K 77/111 |
| 2022/0238049 A1* | 7/2022 | Min | G09F 9/301 |
| 2022/0294886 A1* | 9/2022 | Seo | G09G 3/035 |
| 2022/0343809 A1* | 10/2022 | Chen | G09F 9/301 |
| 2023/0049246 A1* | 2/2023 | Wang | G06F 1/1652 |
| 2023/0144564 A1* | 5/2023 | Lee | H04M 1/0216 428/12 |
| 2023/0161377 A1* | 5/2023 | Lee | G06F 1/1641 361/679.01 |

FOREIGN PATENT DOCUMENTS

| | | |
|---|---|---|
| CN | 110767096 A | 2/2020 |
| CN | 110992828 A | 4/2020 |
| CN | 112002230 A | 11/2020 |
| CN | 211928943 U | 11/2020 |
| CN | 112037662 A | 12/2020 |
| CN | 112150926 A | 12/2020 |
| CN | 112382198 A | 2/2021 |
| CN | 112967610 A | 6/2021 |
| CN | 113393773 A | 9/2021 |
| EP | 3588243 A1 | 1/2020 |
| WO | 2021008162 A1 | 1/2021 |

OTHER PUBLICATIONS

Written Opinion of the International Search Authority in International application No. PCT/CN2021/128429, mailed on Jun. 28, 2022.

Chinese Office Action issued in corresponding Chinese Patent Application No. 202111219847.5 dated Apr. 26, 2022, pp. 1-12.

* cited by examiner

FLEXIBLE DISPLAY MODULE AND MOBILE TERMINAL

CROSS-REFERENCE TO RELATED APPLICATION

This application is a national phase application under 35 U.S.C. § 371 of PCT Application No. PCT/CN2021/128429, filed Nov. 3, 2021, which claims priority to Chinese Application No. 202111219847.5, filed Oct. 20, 2021, the contents of which are incorporated herein by reference in their entirety.

FIELD OF INVENTION

This disclosure relates to a technical field of a display, and more particularly to a flexible display module and a mobile terminal.

BACKGROUND OF INVENTION

An organic light-emitting diode (OLED) has good characteristics including the low power consumption, the lightweight structure, and the ability of performing independent self-light emitting without a backlight condition, so that a flexible OLED display has entered a commercialization stage. With the development of the folding technology, people's requirements on the new styles of folding display products become more and more diversified, and researchers in the field also constantly explore the researches from unidirectional folding to bidirectional folding, and the researches from pure curl to stretchable and scalable display products.

The bidirectional foldable mobile phone is a whole new concept of a new folding display product. Such the product changes the use experience feeling and function of the conventional unidirectional foldable mobile phone, and the device mainly has an OLED screen that can be folded in two-dimensional directions to form a cross folding pattern, so that the device can be used as a mobile phone, and can also implement the use effect of the notebook computer. However, the biggest challenge of such the design method resides in that the module film layer material of the region in the bidirectional bendable cross region of the OLED module concurrently withstands alternating stresses in two directions, so that the phenomena of module debonding and display device layer failure frequently occur, thereby affecting the development of the bidirectional foldable product.

SUMMARY OF INVENTION

Technical Problems

An embodiment of this disclosure provides a flexible display module and a mobile terminal to relieve stresses exerted onto a bidirectional bendable cross region of a conventional bidirectional foldable product.

Technical Solutions

To implement the above-mentioned objective, an embodiment of this disclosure provides a flexible display module including a first bending region extending in a first direction, a second bending region extending in a second direction, and at least one bidirectional bending region located at an overlap position between the first bending region and the second bending region, wherein a predetermined included angle is formed between the first direction and the second direction;

wherein the flexible display module includes a display panel and a support layer disposed away from a light emitting side of the display panel, the support layer includes a cut-out structure, and the cut-out structure is at least disposed in the bidirectional bending region;

wherein the cut-out structure includes multiple cut-out holes, the cut-out hole includes a long axis and a short axis arranged in a cross manner, the long axis is disposed in parallel with one of the first direction and the second direction, and the short axis is disposed in parallel with the other one of the first direction and the second direction.

In the flexible display module provided by the embodiment of this disclosure, the cut-out hole penetrates through the support layer and has a centrosymmetric structure.

In the flexible display module provided by the embodiment of this disclosure, two opposite ends of the cut-out hole in an extending direction along the long axis and two opposite ends of the cut-out hole in an extending direction along the short axis have arc shapes.

In the flexible display module provided by the embodiment of this disclosure, the cut-out hole includes first arc parts disposed on two opposite ends in the extending direction along the short axis, and second arc parts disposed on two opposite ends in the extending direction along the long axis; wherein the first arc part is convex in a direction toward a center of symmetry of the cut-out hole, and the second arc part is convex in a direction away from the center of symmetry of the cut-out hole.

In the flexible display module provided by the embodiment of this disclosure, the cut-out hole further includes a first inclined straight line segment, a second inclined straight line segment and a third arc part, wherein the first inclined straight line segment is connected to the second arc part and the third arc part, and the second inclined straight line segment is connected to the first arc part and the third arc part.

In the flexible display module provided by the embodiment of this disclosure, each of the first arc part, the second arc part and the third arc part is a continuous arc having a uniform radius.

In the flexible display module provided by the embodiment of this disclosure, a ratio of a radius of the first arc part, a radius of the second arc part and a radius of the third arc part is M:N:Q, where M ranges from 0.5 mm to 6 mm, N ranges from 0.2 mm to 0.6 mm, and Q ranges from 0.2 mm to 0.6 mm.

In the flexible display module provided by the embodiment of this disclosure, in an arbitrary one of adjacent two of the cut-out holes, the first arc part of one of the cut-out holes corresponds to the second arc part of the other one of the cut-out holes, and an included angle between the second inclined straight line segments on two sides of the first arc part is equal to an included angle between the first inclined straight line segments on two sides of the second arc part.

In the flexible display module provided by the embodiment of this disclosure, the included angle between the first inclined straight line segments on the two sides of the second arc part ranges from 110° to 150°, and the included angle between the second inclined straight line segments on the two sides of the first arc part ranges from 110° to 150°.

In the flexible display module provided by the embodiment of this disclosure, the cut-out hole includes a first symmetry axis and a second symmetry axis crossing the first symmetry axis; wherein the first symmetry axis is the long axis, and the second symmetry axis is the short axis.

In the flexible display module provided by the embodiment of this disclosure, multiple ones of the cut-out holes include a first cut-out hole and a second cut-out hole; wherein the first symmetry axis of the first cut-out hole is parallel with the first direction, the second symmetry axis of the first cut-out hole is parallel with the second direction, the first symmetry axis of the second cut-out hole is parallel with the second direction, and the second symmetry axis of the second cut-out hole is parallel with the first direction.

In the flexible display module provided by the embodiment of this disclosure, multiple ones of the cut-out holes are arranged in an array, and an arbitrary set of adjacent two of the cut-out holes includes the first cut-out hole and the second cut-out hole.

In the flexible display module provided by the embodiment of this disclosure, a gap between the first cut-out hole and the second cut-out hole, which are adjacent to each other, in the first direction is equal to a gap between the first cut-out hole and the second cut-out hole, which are adjacent to each other, in the second direction.

In the flexible display module provided by the embodiment of this disclosure, a center of symmetry of each of the second cut-out holes adjacent to an arbitrary one of the first cut-out holes is disposed on a virtual circle having a center being a center of symmetry of the first cut-out hole, and the center of symmetry of each of the first cut-out holes adjacent to an arbitrary one of the second cut-out holes is disposed on a virtual circle having a center being the center of symmetry of the second cut-out hole.

In the flexible display module provided by the embodiment of this disclosure, the cut-out structure is disposed in the first bending region, the second bending region and the bidirectional bending region, and multiple ones of the cut-out holes are arranged in an array in the first bending region, the second bending region and the bidirectional bending region.

In the flexible display module provided by the embodiment of this disclosure, a depth of the cut-out hole is smaller than a thickness of the support layer.

In the flexible display module provided by the embodiment of this disclosure, the cut-out structure includes a first cut-out structure disposed on one side of the support layer near the display panel, and a second cut-out structure disposed on one side of the support layer away from the display panel; wherein multiple ones of the cut-out holes of the first cut-out structure are discommunicated from multiple ones of the cut-out holes of the second cut-out structure.

In the flexible display module provided by the embodiment of this disclosure, the flexible display module further includes a backpanel and a heat dissipating film layer disposed between the display panel and the support layer, and a polarizer, a flexible substrate and a flexible cover plate disposed on one side of the display panel away from the support layer.

In the flexible display module provided by the embodiment of this disclosure, a material of the support layer is at least one of a manganese steel, a titanium alloy and a magnesium aluminum alloy.

An embodiment of this disclosure provides a mobile terminal including a main terminal body and a flexible display module, wherein the main terminal body and the flexible display module are combined into one unit;

wherein the flexible display module includes a first bending region extending in a first direction, a second bending region extending in a second direction, and at least one bidirectional bending region located at an overlap position between the first bending region and the second bending region, wherein a predetermined included angle is formed between the first direction and the second direction;

wherein the flexible display module includes a display panel and a support layer disposed away from a light emitting side of the display panel, the support layer includes a cut-out structure, and the cut-out structure is at least disposed in the bidirectional bending region;

wherein the cut-out structure includes multiple cut-out holes, the cut-out hole includes a long axis and a short axis arranged in a cross manner, the long axis is disposed in parallel with one of the first direction and the second direction, and the short axis is disposed in parallel with the other one of the first direction and the second direction.

Useful Effects

An embodiment of this disclosure provides a flexible display module and a mobile terminal, and the flexible display module includes a first bending region extending in a first direction, a second bending region extending in a second direction, and at least one bidirectional bending region located at an overlap position between the first bending region and the second bending region, wherein a predetermined included angle is formed between the first direction and the second direction. The flexible display module includes a display panel and a support layer disposed away from a light emitting side of the display panel. The embodiment of this disclosure provides a cut-out structure on the support layer. The cut-out structure is at least disposed in the bidirectional bending region. The cut-out structure includes multiple cut-out holes. The cut-out hole includes a long axis and a short axis arranged in a cross manner. The long axis is disposed in parallel with one of the first direction and the second direction, and the short axis is disposed in parallel with the other one of the first direction and the second direction, thereby decreasing the bending rigidity of the support layer in the dual bending region, and enhancing the flexibility of the flexible display module in the bidirectional bending region, so that it can be well adapted and withstand two-dimensional alternating stresses induced in the bidirectional folding process.

DESCRIPTION OF DRAWINGS

The technical solutions and other beneficial effects of this disclosure will become obvious by describing the specific implementation embodiments of this disclosure in detail below in conjunction with the accompanying drawings.

DETAILED DESCRIPTION OF EMBODIMENTS

This disclosure provides a flexible display module and a mobile terminal. In order to make the purpose, technical solution and effect of this disclosure become clearer and more definite, this disclosure will be further described in detail in the following with reference to the drawings and embodiments. It should be understood that the specific embodiments described herein are only used to explain this disclosure without limiting this disclosure.

An embodiment of this disclosure provides a flexible display module and a mobile terminal. Detailed descriptions will be respectively made in the following. It should be noted that the order of descriptions in the following embodiments is not intended to limit the preferred order of the embodiments.

Figure 1:
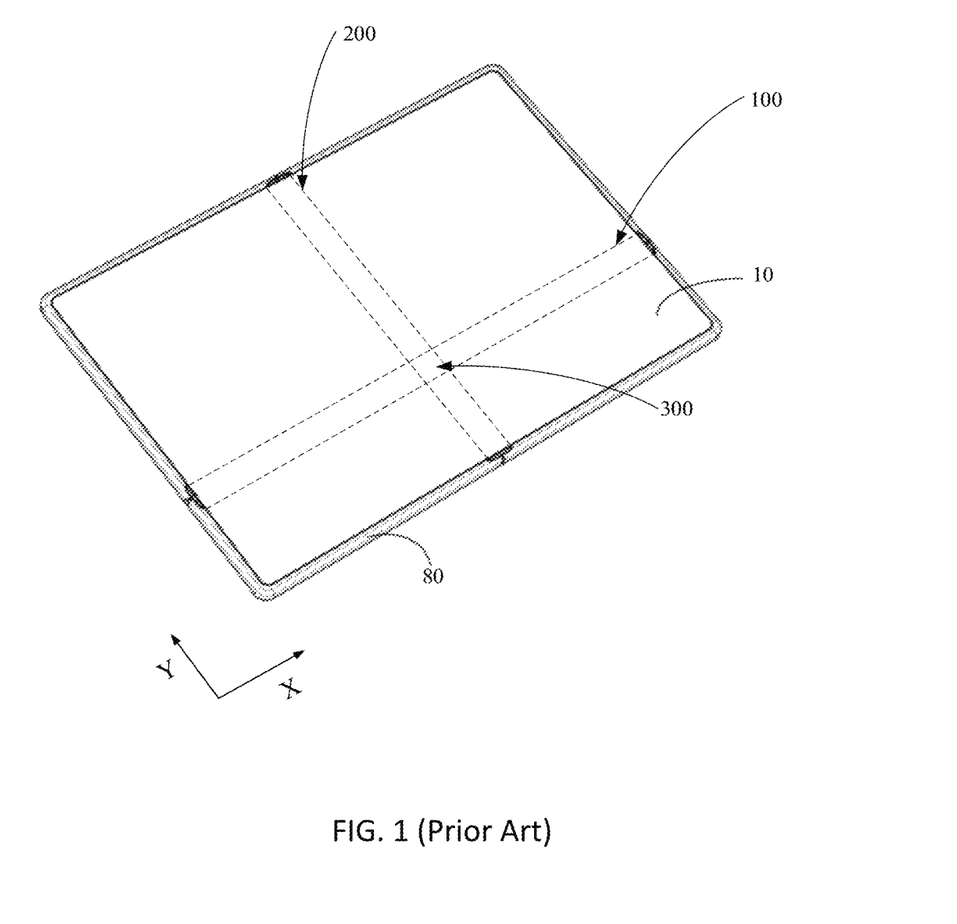
FIG. 1 is a schematic structure view showing a conventional flexible display module.

FIG. 1 is a schematic structure view showing a conventional flexible display module. Referring to FIG. 1, the conventional flexible display module includes a first bending region 100 extending in a first direction, a second bending region 200 extending in a second direction, and at least one bidirectional bending region 300 located at an overlap position between the first bending region 100 and the second bending region 200, wherein the first direction is indicated by Y, the second direction is indicated by X, and the first direction Y is perpendicular to the second direction X. The flexible display module includes a display panel 10, a support layer (not shown in the drawing) disposed away from a light emitting side of the display panel 10 and a middle frame 80 surrounding the display panel 10.

The flexible display module can be folded in the first bending region 100 and the second bending region 200 to form a cross folding pattern, so that the flexible display module can be used in the mobile phone as well as the notebook computer. However, the biggest challenge of such design method is the bidirectional bendable bidirectional bending region 300. Because the module film layer material of the region needs to concurrently withstand alternating stresses in two directional dimensions, the phenomena of module debonding and display device layer failure frequently occur, thereby affecting the development of the bidirectional bendable display module. Based on this, an embodiment of this disclosure provides a flexible display module and a mobile terminal for relieving the bending stresses of the conventional flexible display module experienced in the bidirectional bendable cross region.

Referring to FIGS. 2 to 10, this disclosure provides a flexible display module including a first bending region 100 extending in a first direction Y, a second bending region 200 extending in a second direction X, and at least one bidirectional bending region 300 located at an overlap position between the first bending region 100 and the second bending region 200, wherein a predetermined included angle is formed between the first direction Y and the second direction X.

Figure 2:
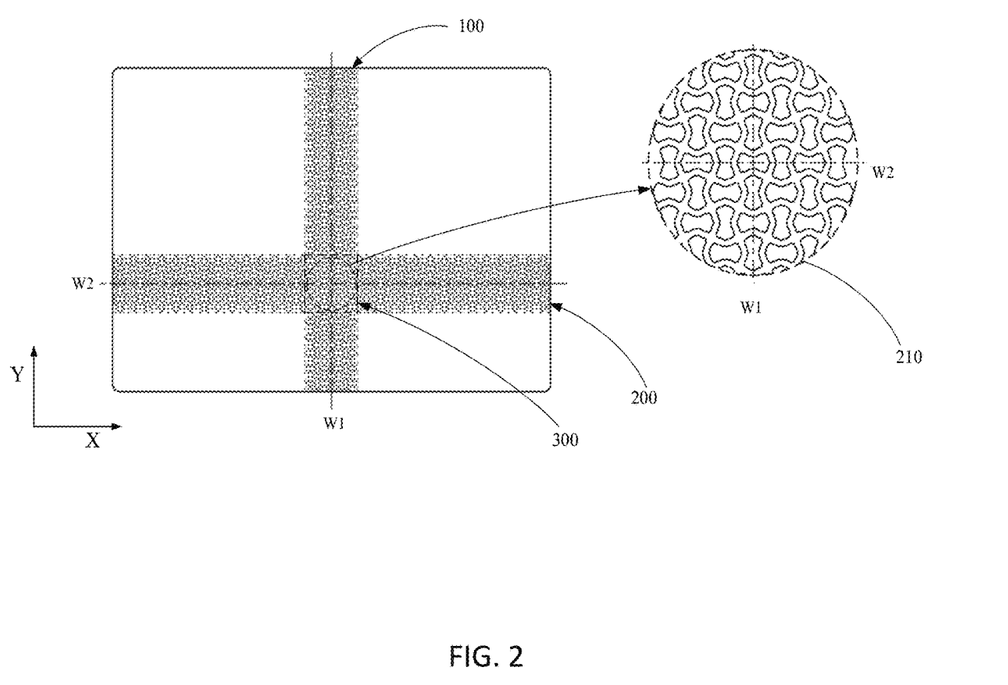
FIG. 2 is a top view showing a support layer of a flexible display device provided by an embodiment of this disclosure.
Figure 3:
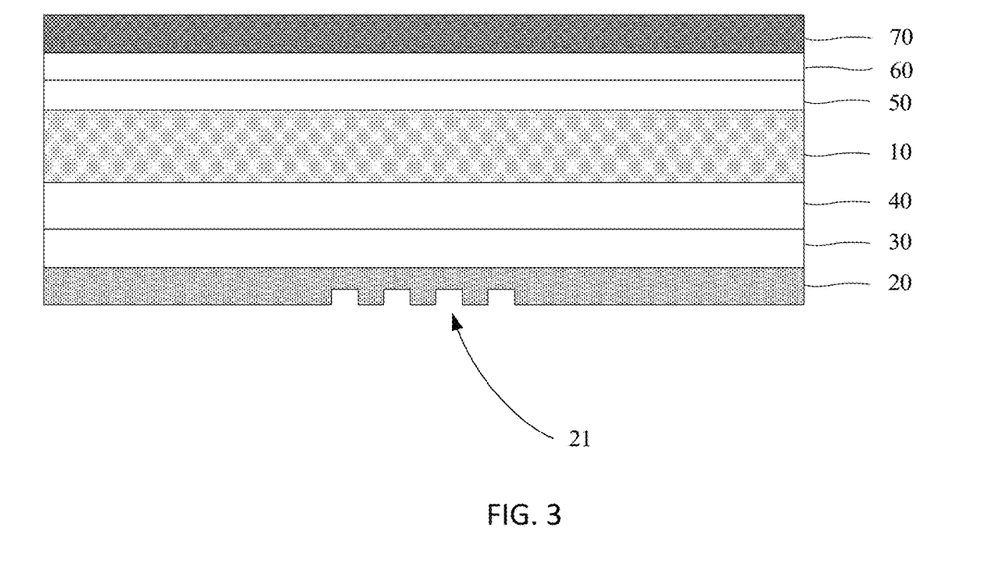
FIG. 3 is a schematic structure view showing a flexible display device provided by an embodiment of this disclosure.

The flexible display module includes a display panel 10 and a support layer 20 disposed away from a light emitting side of the display panel 10, the support layer 20 includes a cut-out structure 21, which is at least disposed in the bidirectional bending region 300.

The cut-out structure 21 includes multiple cut-out holes 210. The cut-out hole 210 includes a long axis and a short axis arranged in a cross manner, wherein the long axis is disposed in parallel with one of the first direction Y and the second direction X, and the short axis is disposed in parallel with the other one of the first direction Y and the second direction X.

In this disclosure, the support layer 20 is provided with a cut-out structure 21, and the cut-out structure 21 is at least disposed in the bidirectional bending region 300, wherein the cut-out structure 21 includes multiple cut-out holes 210, and the cut-out hole 210 includes a long axis and a short axis arranged in a cross manner. The long axis is disposed in parallel with one of the first direction Y and the second direction X, and the short axis is disposed in parallel with the other one of the first direction Y and the second direction X. Therefore, it is possible to decrease the bending rigidity of the support layer 20 within the bidirectional bending region 300 and improve the flexibility of the flexible display module in the bidirectional bending region 300. So, it can be well adapted and withstand the two-dimensional alternating stresses induced in the bidirectional folding process, and thus prevent the flexible display module from undergoing the phenomena, such as film layer debonding, breaking and the like, in the bending process, and improve the overall yield and reliability of the flexible display module.

The technical solutions of this disclosure will now be described in conjunction with specific embodiments.

FIG. 2 is a top view showing a support layer of a flexible display device provided by an embodiment of this disclosure, and FIG. 3 is a schematic structure view showing a flexible display device provided by an embodiment of this disclosure.

Referring to FIGS. 2 and 3, this embodiment provides a flexible display panel 10 including the first bending region 100 extending in the first direction Y, the second bending region 200 extending in the second direction X, and the at least one bidirectional bending region 300 located at the overlap position between the first bending region 100 and the second bending region 200, wherein a predetermined included angle is formed between the first direction Y and the second direction X.

Specifically, as shown in FIG. 2, the first direction is indicated by Y, the second direction is indicated by X, and the predetermined included angle between the first direction Y and the second direction X is equal to 90°, wherein a first bending axis W1 of the first bending region 100 is parallel with the first direction Y, the flexible display module is bent in the first direction Y, a second bending axis W2 of the second bending region 200 is parallel with the second direction X, and the flexible display module is bent in the second direction X. That is, the flexible display module has a cross folding pattern.

In this embodiment, exemplary explanation will be made to the flexible display panel 10 proposed by this embodiment by taking the predetermined included angle between the first direction Y and the second direction X being equal to 90° as an example. It is understandable that this embodiment does not make specific restrictions to the predetermined included angle between the first direction Y and the second direction X.

In this embodiment, the flexible display module includes the display panel 10 and the support layer 20 disposed away from the light emitting side of the display panel 10, and the support layer 20 includes a cut-out structure 21, which is at least disposed in the bidirectional bending region 300. The cut-out structure includes multiple cut-out holes 210. The cut-out hole 210 includes a long axis (not marked in the picture) and a short axis (not marked in the picture) arranged in a cross manner, wherein the long axis is disposed in parallel with one of the first direction Y and the second direction X, and the short axis is disposed in parallel with the other one of the first direction Y and the second direction X. Preferably, the cut-out hole 210 in this embodiment penetrates through the support layer 20, and the cut-out hole 210 has a centrosymmetric structure.

It is understandable that in this embodiment, the long axis is disposed in parallel with the first direction Y, and the short axis is disposed in parallel with the second direction X; or the long axis is disposed in parallel with the second direction X, and the short axis is disposed in parallel with the first direction Y. So, this embodiment does not provide specific restrictions thereto.

In this embodiment, two opposite ends of the cut-out hole 210 in an extending direction along the long axis, and two opposite ends of the cut-out hole in an extending direction along the short axis have arc shapes.

It is understandable that in the bidirectional bending region 300, the flexible display module can be bent in the first direction Y and bent in the second direction X concurrently. Therefore, the module film layer material of the region needs to concurrently withstand alternating stresses in two directional dimensions. In this embodiment, the cut-out structure 21 is disposed on the support layer 20, and the support layer 20 is at least disposed in the bidirectional bending region 300, wherein the support layer 20 includes multiple cut-out holes 210, the cut-out hole 210 has a centrosymmetric structure and penetrates through the support layer 20, the cut-out hole 210 includes a long axis and a short axis arranged in a cross manner, and two opposite ends of the cut-out hole 210 in an extending direction along the long axis and two opposite ends of the cut-out hole in an extending direction along the short axis have arc shapes, wherein the long axis is disposed in parallel with one of the first direction Y and the second direction X, and the short axis is disposed in parallel with the other one of the first direction Y and the second direction X. With the above-mentioned configurations, the bending rigidity of the support layer 20 within the bidirectional bending region 300 is decreased, and the flexibility of the flexible display module in the bidirectional bending region 300 is improved, so that it can be well adapted and withstand the two-dimensional alternating stresses induced in the bidirectional folding process, the coordinating deformation effect between the support layer 20 and other film layer in the bidirectional folding process can be achieved, the risks of film layer debonding and breaking in the flexible display module can be decreased, and the overall yield and the reliability of the flexible display module can be increased.

In this embodiment, the display panel 10 may be an OLED display panel 10, may also be a light-emitting diode (LED) display panel 10, and this embodiment does not provide specific restrictions thereto. The display panel 10 includes, without limitation to, a metal layer, an insulating layer, an active layer and a second metal layer, which are conventional film layers, sequentially layered and disposed on one side of the underlay substrate away from the support layer 20, and this embodiment does not provide detailed descriptions thereof.

Specifically, the flexible display module further includes a backpanel 40 and a heat dissipating film layer 30 disposed between the display panel 10 and the support layer 20, the heat dissipating film layer 30 is disposed between the backpanel 40 and the support layer 20, the film layers can be adhered together through an optical adhesive layer or a pressure sensitive adhesive layer, and both the support layer 20 and the heat dissipating film layer 30 have integral structures. The material of the optical adhesive layer may be an optically clear adhesive (OCA), which is a special adhesive used to adhere the transparent optical device, and has advantages of colorless transparent, the light transmittance higher than 90%, the good adhesion strength, and the above-mentioned viscoelasticity.

In this embodiment, the material of the support layer 20 includes, without limitation to, a manganese steel, a titanium alloy and a magnesium aluminum alloy, and the material of the heat dissipating film layer 30 includes, without limitation to, a foam rubber. Preferably, the material of the support layer 20 is a high-strength steel sheet containing manganese, and the limited allowable stress of the selected material is not smaller than 1600 MPa. It is understandable that the material selection of the support layer 20 is determined according to the structural strength and malleability of the material, and this embodiment does not provide specific restrictions thereto.

It is to be described that the heat dissipating film layer 30 in this embodiment dissipates the heat from the entire surface of the display panel 10, and the entire surface of the support layer 20 supports the display panel 10, so that the display panel 10 is held at the good smoothness.

Further, the flexible display module further includes a polarizer 50, an ultra-thin glass (UTG) 60 and a flexible cover plate 70 sequentially disposed on one side of the display panel 10 away from the support layer 20. The polarizer 50 is a polymeric thin film layer having the optical property of the high degree of polarization and the high-temperature and high-humidity withstanding characteristics, and has the good flexibility and ductility. Preferably, the material of the polarizer 50 is polyvinyl alcohol (PVA). In order to guarantee the foldability of the UTG 60, a thickness of the UTG 60 corresponding to the bending region is generally smaller than 70 μm. The flexible cover plate 70 includes a transparent polymeric material and has the good optical property and the wear-resistant property, thereby providing the screen protection function. Preferably, the flexible cover plate 70 may be selected from an arbitrary one of a glass cover plate or cover glass (CG) and a 3D cover plate, and this embodiment does not provide specific restrictions thereto.

Figure 4:
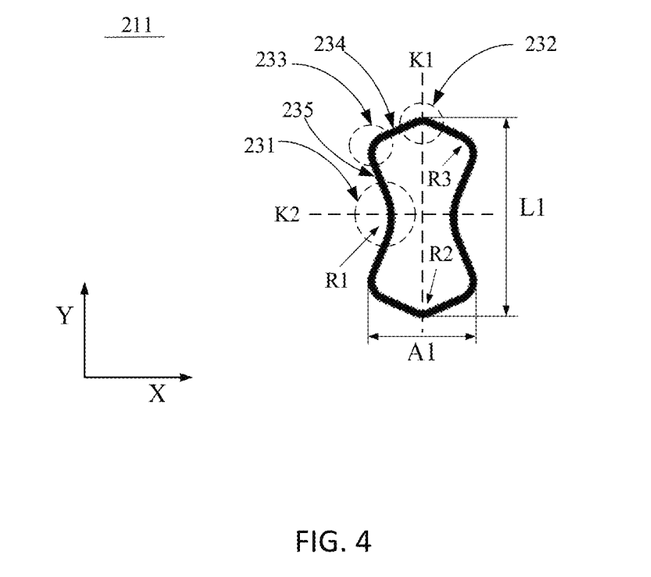
FIG. 4 is a schematic structure view showing a first cut-out hole provided by an embodiment of this disclosure.
Figure 5:
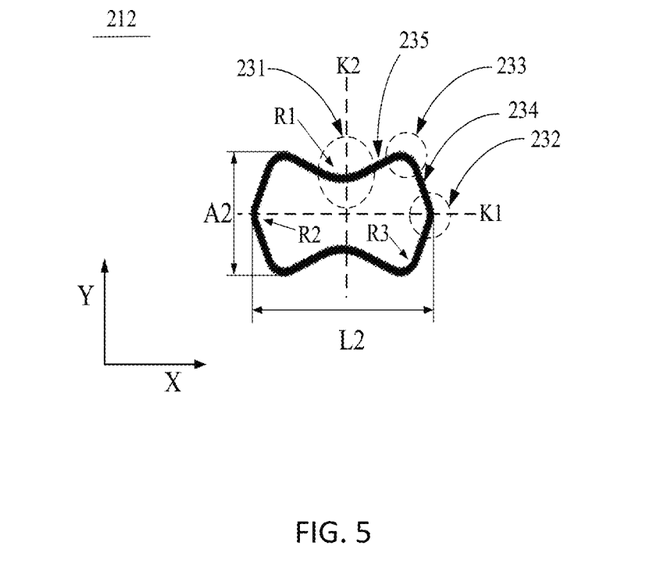
FIG. 5 is a schematic structure view showing a second cut-out hole provided by an embodiment of this disclosure.

Please refer to FIGS. 2, 4 and 5. FIG. 4 is a schematic structure view showing a first cut-out hole provided by an embodiment of this disclosure; FIG. 5 is a schematic structure view showing a second cut-out hole provided by an embodiment of this disclosure.

In this embodiment, the cut-out hole 210 includes first arc parts disposed on two opposite ends in the extending direction along a short axis 231, and second arc parts disposed on two opposite ends in the extending direction along a long axis 232. The first arc part 231 is convex in a direction toward a center of symmetry of the cut-out hole 210, and the second arc part 232 is convex in a direction away from the center of symmetry of the cut-out hole 210. This is beneficial to the relieving of the stress concentration phenomenon of the flexible display module in the bending process, thereby enhancing the bending resistance.

Specifically, the cut-out hole 210 in this embodiment further includes a first inclined straight line segment 234, a second inclined straight line segment 235 and a third arc part 233. The first inclined straight line segment 234 is connected to the second arc part 232 and the third arc part 233, the second inclined straight line segment 235 is connected to the first arc part 231 and the third arc part 233, the first inclined straight line segment 234 is tangent to the second arc part 232 at a connection portion, the first inclined straight line segment 234 is tangent to the third arc part 233 at a connection portion, the second inclined straight line segment 235 is tangent to the first arc part 231 at a connection portion, and the second inclined straight line segment 235 is tangent to the third arc part 233 at a connection portion.

It is understandable that this embodiment provides the cut-out hole 210 further including the first inclined straight line segment 234, the second inclined straight line segment 235 and the third arc part 233, wherein the first inclined straight line segment 234 is connected to the second arc part 232 and the third arc part 233, and the second inclined straight line segment 235 is connected to the first arc part 231 and the third arc part 233. So, it is possible to decrease the stress concentration phenomenon of the edge portion of the structure of the cut-out hole 210 upon bending, put off the formation of the fatigue crack, and thus relieve the stress concentration phenomenon of the flexible display module in the bending process.

Preferably, a radius R1 of the first arc part 231 is greater than a radius R2 of the second arc part 232, and the radius R2 of the second arc part 232 is equal to a radius R3 of the third arc part 233, so that it is beneficial to the etching formation of the cut-out hole 210, and the bending performance of the support layer 20 cannot be affected.

Specifically, a ratio of the radius R1 of the first arc part 231, the radius R2 of the second arc part 232 and the radius R3 of the third arc part 233 is M:N:Q in this embodiment, where M ranges from 0.5 mm to 6 mm, N ranges from 0.2 mm to 0.6 mm, and Q ranges from 0.2 mm to 0.6 mm.

In one embodiment, if the flexible display module is a foldable computer, then the bending radius of the flexible display module is equal to 5 mm. It is obtained, through simulation analysis, that the radius R1 of the first arc part 231 is equal to 6 mm, the radius R2 of the second arc part 232 ranges from 0.2 mm to 0.6 mm, and the radius R3 of the third arc part 233 ranges from 0.2 mm to 0.6 mm. Preferably, the radius R2 of the second arc part 232 is equal to the radius R3 of the third arc part 233, and both R2 and R3 are equal to 0.6 mm, thereby satisfying the bendable performance of the flexible display module. Meanwhile, it is beneficial to the etching formation of the cut-out hole 210, and the bending performance of the support layer 20 cannot be affected.

In another embodiment, if the flexible display module is a foldable mobile phone, then the bending radius of the flexible display module is equal to 1.5 mm. It is obtained, through the simulation analysis, that the radius R1 of the first arc part 231 is equal to 0.72 mm, the radius R2 of the second arc part 232 ranges from 0.2 mm to 0.6 mm, and the radius R3 of the third arc part 233 ranges from 0.2 mm to 0.6 mm. Preferably, the radius R2 of the second arc part 232 is equal to the radius R3 of the third arc part 233, and both R2 and R3 are equal to 0.24 mm, thereby satisfying the bendable performance of the flexible display module. Meanwhile, it is beneficial to the etching formation of the cut-out hole 210, and the bending performance of the support layer 20 cannot be affected.

It is understandable that this embodiment is only illustrated according to the following conditions: the flexible display module is the foldable computer, the bending radius of the flexible display module is equal to 5 mm, the radius R1 of the first arc part 231 is equal to 6 mm, the radius R2 of the second arc part 232 is equal to 0.6 mm, and a radius R3 of the third arc part 233 is equal to 0.6 mm. In the actual engineering implementation, when the bending radius of the flexible display module is determined, the optimal dimensions of the radius R1 of the first arc part 231, the radius R2 of the second arc part 232 and the radius R3 of the third arc part 233 need to be determined through the comprehensive evaluation of the force analysis and the rebound force measurement and the comprehensive consideration of the range of each characteristic value. This embodiment ensures the bending performance of the flexible display panel 10 through such the method.

Similarly, this embodiment is only illustrated according to the following conditions: the flexible display module is the foldable mobile phone, the bending radius of the flexible display module is equal to 1.5 mm, the radius R1 of the first arc part 231 is equal to 0.72 mm, the radius R2 of the second arc part 232 is equal to 0.24 mm, and the radius R3 of the third arc part 233 is equal to 0.24 mm.

Preferably, in an arbitrary set of adjacent two of the cut-out holes 210 in this embodiment, the first arc part 231 of one of the cut-out holes 210 corresponds to the second arc part 232 of the other one of the cut-out holes 210, and an included angle between the second inclined straight line segments 235 on two sides of the first arc part 231 is equal to an included angle between the first inclined straight line segments 234 on two sides of the second arc part 232.

Specifically, an included angle between the first inclined straight line segments 234 on two sides of the second arc part 232 ranges from 110° to 150°, and an included angle between the second inclined straight line segments 235 on two sides of the first arc part 231 ranges from 110° to 150°. Preferably, an included angle between the first inclined straight line segments 234 on two sides of the second arc part 232 is equal to 134°, and an included angle between the second inclined straight line segments 235 on two sides of the first arc part 231 is equal to 134°. It is understandable that this embodiment is configured such that an included angle between the first inclined straight line segments 234 on two sides of the second arc part 232 is equal to an included angle between the second inclined straight line segments 235 on two sides of the first arc part 231. Therefore, it is possible to decrease the bending rigidity of the support layer 20 within the bidirectional bending region 300, and improve the flexibility of the flexible display module in the bidirectional bending region 300, so that it can be well adapted and withstand the two-dimensional alternating stresses induced in the bidirectional folding process.

In this embodiment, the cut-out hole 210 includes a first symmetry axis K1 and a second symmetry axis K2 crossing the first symmetry axis K1, wherein the first symmetry axis K1 is the long axis, and the second symmetry axis K2 is the short axis.

Further, multiple ones of the cut-out holes 210 include a first cut-out hole 211 and a second cut-out hole 212. The first symmetry axis K1 of the first cut-out hole 211 is parallel with the first direction Y, the second symmetry axis K2 of the first cut-out hole 211 is parallel with the second direction X, the first symmetry axis K1 of the second cut-out hole 212 is parallel with the second direction X, and the second symmetry axis K2 of the second cut-out hole 212 is parallel with the first direction Y.

It is to be described that exemplary explanations are made to the cut-out hole 210 provided by this embodiment by taking the configurations that the first symmetry axis K1 is perpendicular to the second symmetry axis K2, and the first cut-out hole 211 is perpendicular to the second cut-out hole 212 in this embodiment.

It is understandable that the configurations that the first symmetry axis K1 of the first cut-out hole 211 is parallel with the first direction Y, the second symmetry axis K2 of the first cut-out hole 211 is parallel with the second direction X, the first symmetry axis K1 of the second cut-out hole 212 is parallel with the second direction X, and the second symmetry axis K2 of the second cut-out hole 212 is parallel with the first direction Y are only used for the exemplary explanation, and this embodiment does not make specific restrictions on the direction of the first cut-out hole 211 and the direction of the second cut-out hole 212.

In this embodiment, the cut-out hole 210 has the symmetrical structure having two large ends and a small middle portion, the cut-out hole 210 includes the first arc parts 231 disposed on two opposite ends in the extending direction along the second symmetry axis K2, and the second arc parts 232 are disposed on two opposite ends in the extending direction along the first symmetry axis K1. The first arc part 231 is convex in a direction toward a center of symmetry of the cut-out hole 210, and the second arc part 232 is convex in a direction away from the center of symmetry of the cut-out hole 210, so that it is beneficial to the relieving of the stress concentration phenomenon of the flexible display module in the bending process, thereby enhancing the bending resistance.

Specifically, in the first cut-out hole 211 of this embodiment, the first arc part 231 is convex in a direction toward a center of symmetry of the first cut-out hole 211, and the second arc part 232 is convex in a direction away from the center of symmetry of the first cut-out hole 211. In the second cut-out hole 212, the first arc part 231 is convex in a direction toward a center of symmetry of the second cut-out hole 212, and the second arc part 232 is convex in a direction away from the center of symmetry of the second cut-out hole 212, wherein the first arc part 231 is a uniform continuous arc with the radius R1, the second arc part 232 is a uniform continuous arc with the radius R2, curvatures of the cut-out holes 210 around the first arc part 231 are all equal to 1/R1, curvatures of the cut-out holes 210 around the second arc part 232 are all equal to 1/R2, the curvatures of the cut-out holes 210 at the first arc part 231 are uniform, and the curvatures of the cut-out holes 210 at the second arc part 232 are uniform.

It is understandable that this embodiment is configured such that the cut-out hole 210 includes the first arc parts 231 disposed on two opposite ends in the extending direction along the second symmetry axis K2 and the second arc part 232 disposed on two opposite ends in the extending direction along the first symmetry axis K1, the first arc part 231 is convex in a direction toward a center of symmetry of the cut-out hole 210, and the second arc part 232 is convex in a direction away from the center of symmetry of the cut-out hole 210. By configuring the uniform continuous first arc parts 231 with the radius R1 and the uniform continuous second arc parts 232 with the radius R2 on the cut-out hole 210, it is beneficial to the relieving of the stress concentration phenomenon of the flexible display module in the bending process, thereby enhancing the bending resistance.

Figure 6:
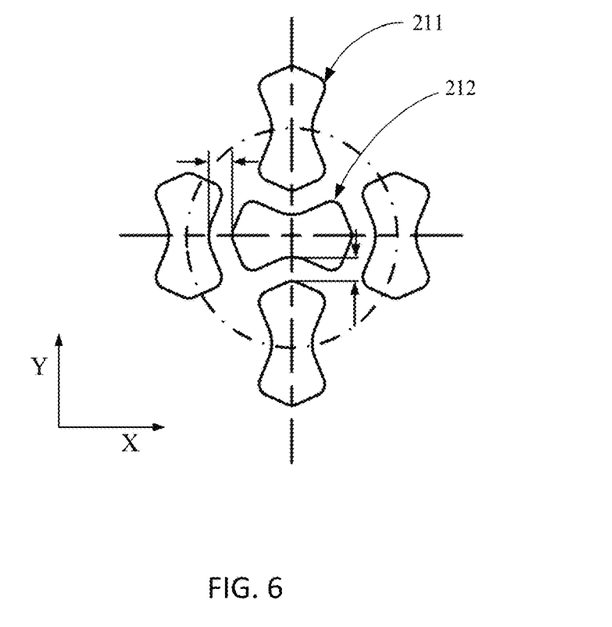
FIG. 6 is a partially cross-sectional view showing the cut-out structure of FIG. 2.
Figure 7:
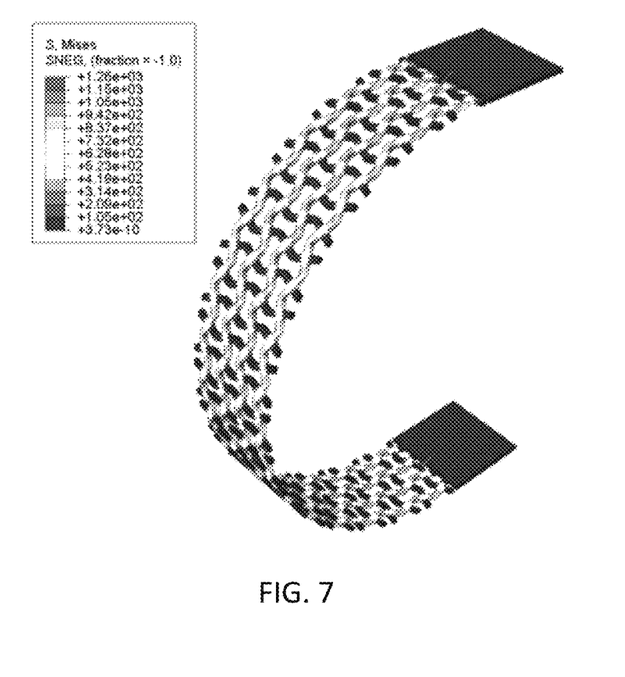
FIG. 7 is a stress cloud diagram showing a support layer provided by an embodiment of this disclosure upon bending.

Please refer to FIGS. 2, 6 and 7. FIG. 6 is a partially cross-sectional view showing the support layer of FIG. 2. FIG. 7 is a stress cloud diagram showing a support layer provided by an embodiment of this disclosure upon bending.

In this embodiment, multiple ones of the cut-out holes 210 are disposed in an axial symmetrical manner with respect to the bending axis of the first bending region 100 and the bending axis of the second bending region 200, multiple ones of the cut-out holes 210 are arranged in an array, and an arbitrary set of adjacent two of the cut-out holes 210 includes the first cut-out hole 211 and the second cut-out hole 212.

Further, the orthographic projections of the first symmetry axis K1 of the first cut-out hole 211 and the second symmetry axis K2 of the second cut-out hole 212, which are adjacent to each other, on the support layer 20 in the first direction Y coincide with each other. The orthographic projections of the second symmetry axis K2 of the first cut-out hole 211 and the first symmetry axis K1 of the second cut-out hole 212, which are adjacent to each other, on the support layer 20 in the second direction X coincide with each other. Therefore, it is possible to decrease the bending rigidity of the support layer 20 within the bidirectional bending region 300, and improve the flexibility of the flexible display module in the bidirectional bending region 300, so that it can be well adapted and withstand the two-dimensional alternating stresses induced in the bidirectional folding process.

In this embodiment, it is understandable that the configurations that the orthographic projections of the first symmetry axis K1 of the first cut-out hole 211 and the second symmetry axis K2 of the second cut-out hole 212, which are adjacent to each other, on the support layer 20 in the first direction Y coincide with each other, and that the orthographic projections of the second symmetry axis K2 of the first cut-out hole 211 and the first symmetry axis K1 of the second cut-out hole 212, which are adjacent to each other, on the support layer 20 in the second direction X coincide with each other are only provided for the exemplary explanations, and this embodiment does not provide the limitative specific configurations for the arrangements of the first cut-out hole 211 and the second cut-out hole 212. For example, in one embodiment, the first cut-out hole 211 and the second cut-out hole 212 adjacent to each other are staggered in the first direction, and the first cut-out hole 211 and the second cut-out hole 212 adjacent to each other are staggered in the second direction, thereby decreasing the bending stress upon bending of the support layer 20.

In this embodiment, a gap H1 between the first cut-out hole 211 and the second cut-out hole 212 adjacent to each other in the first direction Y is equal to a gap H2 between the first cut-out hole 211 and the second cut-out hole 212 adjacent to each other in the second direction X.

Specifically, the gap between the first cut-out hole 211 and the second cut-out hole 212 adjacent to each other in the first direction Y is the distance between the second arc part 232 of the first cut-out hole 211 and the first arc part 231 of the second cut-out hole 212, and the gap between the first cut-out hole 211 and the second cut-out hole 212 adjacent to each other in the second direction X is the distance between the first arc part 231 of the first cut-out hole 211 and the second arc part 232 of the second cut-out hole 212. Because the first arc part 231 is a uniform continuous arc with the radius R1, and the second arc part 232 is a uniform continuous arc with the radius R2, the gap between the first cut-out hole 211 and the second cut-out hole 212 adjacent to each other in the first direction Y is uniform, and the gap between the first cut-out hole 211 and the second cut-out hole 212 adjacent to each other in the second direction X is uniform.

In this embodiment, a center of symmetry of each of the second cut-out holes 212 adjacent to an arbitrary one of the first cut-out holes 211 is disposed on a virtual circle having a center being a center of symmetry of the first cut-out hole 211, and the center of symmetry of each of the first cut-out holes 211 adjacent to an arbitrary one of the second cut-out holes 212 is disposed on a virtual circle having a center being the center of symmetry of the second cut-out hole 212. It is understandable that the above-mentioned structural characteristics of the first cut-out hole 211 and the second cut-out hole 212 can guarantee the uniform stress distribution of each part in the bending process of the bidirectional bending region 300 of the support layer 20. Meanwhile, the extension deformation amount of each part of the support layer 20 is kept balanced, thereby decreasing the risk of the broken and failed support layer 20.

It is understandable that in this embodiment, the bidirectional bending region 300 is located at the overlap position between the first bending region 100 and the second bending region 200, and this embodiment is configured such that a cut-out structure 21 is disposed on the support layer 20, and is at least disposed in the bidirectional bending region 300. Preferably, the cut-out structure 21 is disposed on the first bending region 100 and the second bending region 200. The cut-out structure 21 includes multiple cut-out holes 210. The cut-out hole 210 includes at least two symmetrical axes. Two opposite ends of the cut-out hole 210 in an extending direction along one symmetrical axis and two opposite ends of the cut-out hole 210 in an extending direction along the other symmetrical axis have arc shapes. The one symmetrical axis of the cut-out hole 210 is parallel with the first direction Y, and the other symmetrical axis is parallel with the second direction X. Therefore, it is possible to decrease the bending rigidity of the support layer 20 in the first bending region 100, the bending rigidity in the second bending region 200 and the bending rigidity in the bidirectional bending region 300. Compared to the existing technology, this embodiment decreases the bending rigidity of the support layer 20 within the bidirectional bending region 300, and improves the flexibility of the flexible display module in the bidirectional bending region 300. Thus, when the flexible display module is withstanding the complicated bidirectional alternating stress, the flexible display module can coordinate the deformations with the adjacent adhesive layer and film layer, thereby decreasing the debonding and breaking risk of the film layer, implementing the folding pattern of the flexible display module in two bending directions, and satisfying the functional requirement of the associated bending flexibility.

As shown in FIG. 7, when the support layer of the flexible display module provided by this embodiment is bent, no terrible stress concentration phenomenon is present. Specifically, the overall stress exerted on the support layer 20 is lower than the limited allowable stress of 1600 MPa of the material of the support layer 20 in this embodiment, thereby preventing the phenomenon of the bending sharp corner of the support layer 20 present in the bending process. Meanwhile, the forced state of the region provided with the support layer 20 is effectively eased and the region has the more continuous arc. It is to be described that in order to ensure that the support layer 20 of the flexible module has no breaking risk, the allowable stress value may be multiplied by a corresponding safety coefficient to obtain a design value upon the specific design. In this embodiment, the preferred the safety coefficient is equal to 0.5 according to the measured data.

Figure 8:
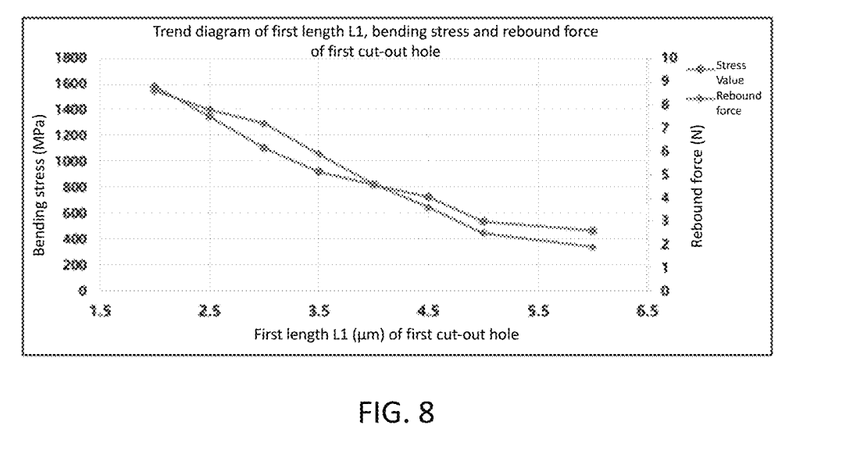
FIG. 8 is a trend chart showing a length value of the first cut-out hole provided by an embodiment of this disclosure in a first direction versus a bending stress and a rebound force.
Figure 9:
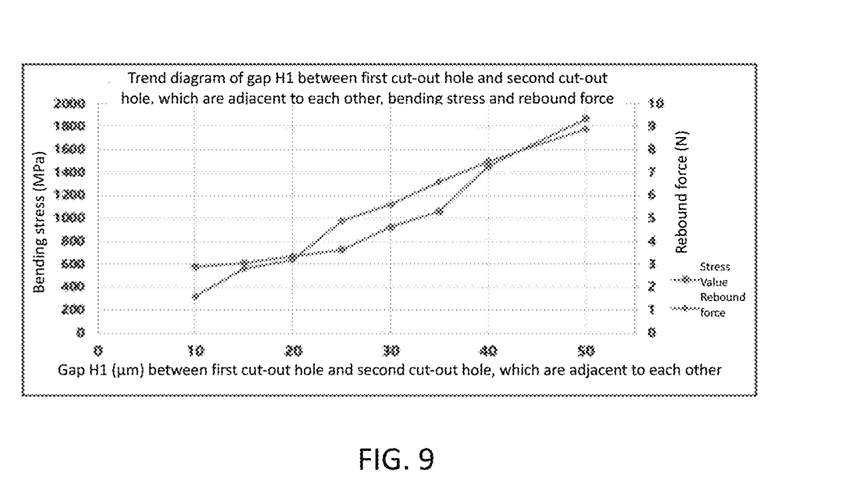
FIG. 9 is a trend chart showing a value of a gap between the first cut-out hole and the second cut-out hole, which are adjacent to each other, in the first direction provided by an embodiment of this disclosure versus the bending stress and the rebound force.
Figure 10:
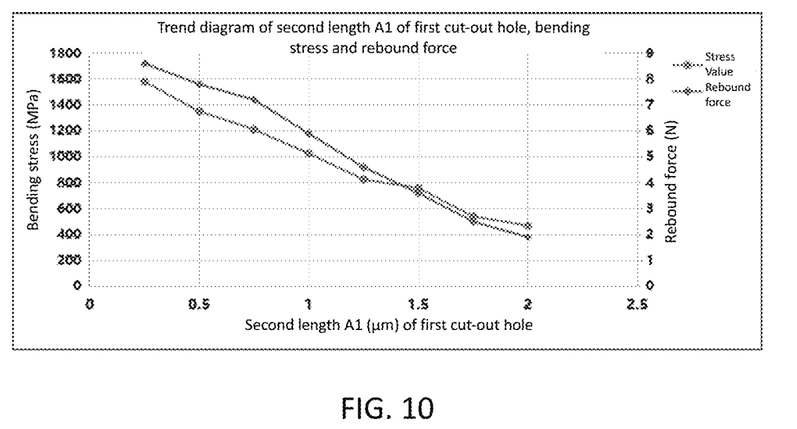
FIG. 10 is a trend chart showing a length value of the first cut-out hole provided by an embodiment of this disclosure in a second direction versus the bending stress and the rebound force.

Please refer to FIGS. 4, 5, 6, 8, 9 and 10. FIG. 8 is a trend chart showing a length value of the first cut-out hole provided by an embodiment of this disclosure in the first direction versus a bending stress and a rebound force. FIG. 9 is a trend chart showing a value of a gap between the first cut-out hole and the second cut-out hole, which are adjacent to each other, in the first direction provided by an embodiment of this disclosure versus the bending stress and the rebound force. FIG. 10 is a trend chart showing a length value of the first cut-out hole provided by an embodiment of this disclosure in the second direction versus the bending stress and the rebound force.

In this embodiment, the first cut-out hole 211 has a first length L1 in the first direction Y, the first cut-out hole 211 has a second length A1 in the second direction X; the second cut-out hole 212 has a third length L2 in the second direction X, and the second cut-out hole 212 has a fourth length A2 in the first direction Y, wherein the first length L1 is equal to the third length L2, and the second length A1 is equal to the fourth length A2.

Exemplary explanations of the cut-out hole 210 of this embodiment are made by taking the dimension of the first cut-out hole 211 as an example.

It is to be described that when the first length L1 gets larger in this embodiment, the bending stress of the support layer 20 can be effectively decreased, but the bending rebound force of the support layer 20 is also decreased at the same time, thereby causing the support layer 20 to become too soft, and the too soft support layer 20 cannot provide the effect of supporting the bending region of the display panel 10. When the second length A1 gets larger, the area of the first cut-out hole 211 is enlarged, thereby causing the support layer 20 to become too soft, thereby affecting the support property of the support layer 20. When the gap H between the first cut-out hole 211 and the second cut-out hole 212 adjacent to each other in the first direction Y gets larger, the area of the support layer 20 is reduced, thereby causing the support layer 20 to have the insufficient flexibility. When the flexible display panel 10 is bent, the larger bending gravity is concentrated on the support layer 20, and the breaking risk is present.

It can be seen, from FIGS. 8, 9 and 10, that the flexibility and bending performance design of the support layer directly relate to the size of the first length, the size of the second length and the size of the gap. Therefore, when the structure of the cut-out hole is designed, the simulation comparison check needs to be performed according to the yield strength value of the selected material of the support layer. Meanwhile, the optimal combination of the characteristic dimension range also needs to be determined according to the synchronous check of the rebound force of the support layer.

Preferably, the first length L1 of the first cut-out hole 211 is equal to 4.5 mm, the gap H1 between the first cut-out hole 211 and the second cut-out hole 212 adjacent to each other in the first direction Y is equal to 20 mm, and the second length A1 of the first cut-out hole 211 is equal to 1.5 mm.

This embodiment adopts the finite element method to perform the calculation and check to optimize the matching relationship of each key dimension while guaranteeing the preconditions that no debonding between the film layer and the adhesive layer of the flexible display module occurs, that the display device layer has no broken part, so that the support layer 20 has a predetermined bending flexibility and can satisfy a predetermined malleability. Therefore, it is possible to enhance the reliability of the flexible display module and the resistance to bending fatigue, and thus to integrally enhance the bending lifetime of the support layer 20, to increase the production yield of the product, and decrease the comprehensive manufacturing cost.

Figure 11:
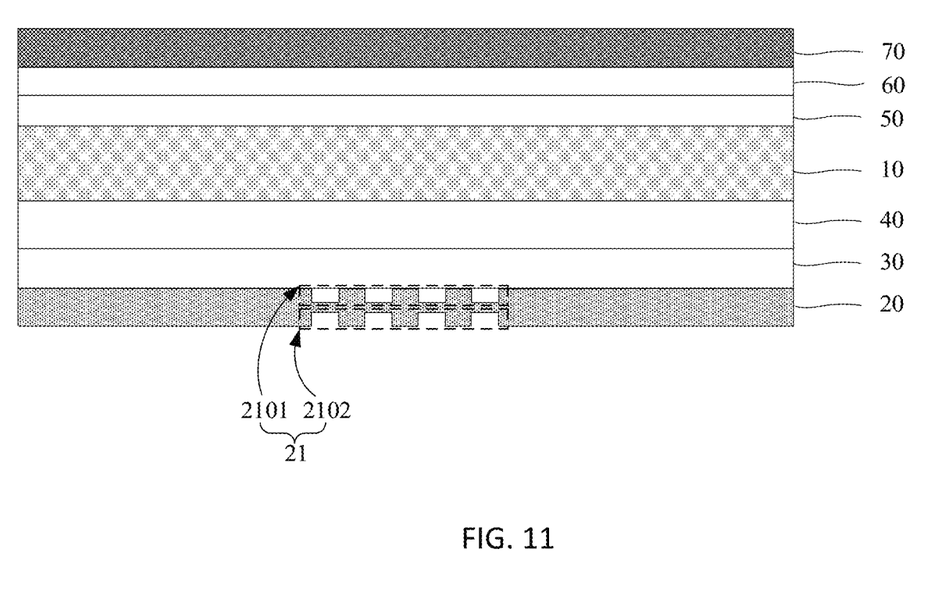
FIG. 11 is a second schematic structure view showing a flexible display device provided by an embodiment of this disclosure.

FIG. 11 is a second schematic structure view showing a flexible display device provided by an embodiment of this disclosure. Referring to FIG. 11, the following contents will be described.

In one embodiment, the cut-out structure 21 includes a first cut-out structure 2101 disposed on one side of the support layer 20 near the display panel, and a second cut-out structure 2102 disposed on one side of the support layer 20 away from the display panel. Multiple ones of the cut-out holes 210 of the first cut-out structure 2101 are discommunicated from multiple ones of the cut-out holes 210 of the second cut-out structure 2102.

It is understandable that this embodiment is configured such that the cut-out structure 21 includes the first cut-out structure 2101 disposed on one side of the support layer 20 near the display panel, and the second cut-out structure 2102 disposed on one side of the support layer 20 away from the display panel, wherein multiple ones of the cut-out holes 210 of the first cut-out structure 2101 are discommunicated from multiple ones of the cut-out holes 210 of the second cut-out structure 2102. Thus, the thickness of the flexible display module is decreased, the bonding strength and reliability of the support layer 20 are improved, and the bending performance of the flexible display module is thus improved.

This embodiment provides a mobile terminal including a main terminal body and the flexible display module in any one of the embodiments, and the main terminal body and the flexible display module are combined into one unit.

It is understandable that the flexible display module has been described in detail in the above-mentioned embodiment, so repeated explanations will not be provided herein.

In specific applications, the mobile terminal may be a display screen of an apparatus, such as a smart mobile phone, a tablet computer, a notebook computer, a smart wristband, a smart watch, smart glasses, a smart helmet, a desktop computer, a smart television or a digital camera, or even may be applied to an electronic apparatus having a flexible display screen.

In summary, this disclosure provides a flexible display module and a mobile terminal. The flexible display module includes a first bending region extending in a first direction, a second bending region extending in a second direction, and at least one bidirectional bending region located at an overlap position between the first bending region and the second bending region. A predetermined included angle is formed between the first direction and the second direction. The display module includes a display panel and a support layer disposed on away from display panel light emitting side. The support layer includes a cut-out structure, which is at least disposed in the bidirectional bending region. The cut-out structure includes multiple cut-out holes. The cut-out hole includes a long axis and a short axis arranged in a cross manner, wherein the long axis is disposed in parallel with one of the first direction and the second direction, and the short axis is disposed in parallel with the other one of the first direction and the second direction. Therefore, it is possible to prevent the flexible display module from undergoing the phenomena, such as film layer debonding, breaking and the like, in the bending process.

It is understandable that, for those of ordinary skill in the art, equivalent replacements or changes can be made according to the technical solutions of this disclosure and its inventive concept, and all these changes or replacements shall belong to the protection scope of the appended claims of this application.

What is claimed is:

1. A flexible display module, comprising a first bending region extending in a first direction, a second bending region extending in a second direction, and at least one bidirectional bending region located at an overlap position between the first bending region and the second bending region, wherein a predetermined included angle is formed between the first direction and the second direction;
wherein the flexible display module comprises a display panel and a support layer disposed away from a light emitting side of the display panel, the support layer comprises a cut-out structure, and the cut-out structure is at least disposed in the bidirectional bending region;
wherein the cut-out structure comprises multiple cut-out holes, the cut-out hole comprises a long axis and a short axis arranged in a cross manner, the long axis is disposed in parallel with one of the first direction and the second direction, and the short axis is disposed in parallel with the other one of the first direction and the second direction, the cut-out hole further comprises first arc parts disposed on two opposite ends in the extending direction along the short axis, second arc parts disposed on two opposite ends in the extending direction along the long axis, a first inclined straight line segment, a second inclined straight line segment and a third arc part;
wherein the first inclined straight line segment is connected to the second arc part and the third arc part, and the second inclined straight line segment is connected to the first arc part and the third arc part, the first arc part is convex in a direction toward a center of symmetry of the cut-out hole, and the second arc part is convex in a direction away from the center of symmetry of the cut-out hole, a radius of the first arc part is greater than a radius of the second arc part, and the radius of the second arc part is equal to a radius of the third arc part.

2. The flexible display module according to claim 1, wherein the cut-out hole penetrates through the support layer and has a centrosymmetric structure.

3. The flexible display module according to claim 2, wherein two opposite ends of the cut-out hole in an extending direction along the long axis and two opposite ends of the cut-out hole in an extending direction along the short axis have arc shapes.

4. The flexible display module according to claim 1, wherein each of the first arc part, the second arc part and the third arc part is a continuous arc having a uniform radius.

5. The flexible display module according to claim 4, wherein a ratio of a radius of the first arc part, a radius of the second arc part and a radius of the third arc part is M:N:Q, where M ranges from 0.5 mm to 6 mm, N ranges from 0.2 mm to 0.6 mm, and Q ranges from 0.2 mm to 0.6 mm.

6. The flexible display module according to claim 1, in an arbitrary set of adjacent two of the cut-out holes, the first arc part of one of the cut-out holes corresponds to the second arc part of the other one of the cut-out holes, wherein an included angle between the second inclined straight line segments on two sides of the first arc part is equal to an included angle between the first inclined straight line segments on two sides of the second arc part.

7. The flexible display module according to claim 6, wherein the included angle between the first inclined straight line segments on the two sides of the second arc part ranges from 110° to 150°, and the included angle between the second inclined straight line segments on the two sides of the first arc part ranges from 110° to 150°.

8. The flexible display module according to claim 1, wherein the cut-out hole comprises a first symmetry axis and a second symmetry axis crossing the first symmetry axis; wherein the first symmetry axis is the long axis, and the second symmetry axis is the short axis.

9. The flexible display module according to claim 8, wherein multiple ones of the cut-out holes comprise a first cut-out hole and a second cut-out hole;
wherein the first symmetry axis of the first cut-out hole is parallel with the first direction, the second symmetry axis of the first cut-out hole is parallel with the second direction, the first symmetry axis of the second cut-out hole is parallel with the second direction, and the second symmetry axis of the second cut-out hole is parallel with the first direction.

10. The flexible display module according to claim 9, wherein multiple ones of the cut-out holes are arranged in an array, and an arbitrary set of adjacent two of the cut-out holes comprises the first cut-out hole and the second cut-out hole.

11. The flexible display module according to claim 10, wherein a gap between the first cut-out hole and the second cut-out hole, which are adjacent to each other, in the first direction is equal to a gap between the first cut-out hole and the second cut-out hole, which are adjacent to each other, in the second direction.

12. The flexible display module according to claim 11, wherein a center of symmetry of each of the second cut-out holes adjacent to an arbitrary one of the first cut-out holes is disposed on a virtual circle having a center being a center of symmetry of the first cut-out hole, the center of symmetry of each of the first cut-out holes adjacent to an arbitrary one of the second cut-out holes is disposed on a virtual circle having a center being the center of symmetry of the second cut-out hole.

13. The flexible display module according to claim 12, wherein the cut-out structure is disposed in the first bending region, the second bending region and the bidirectional bending region, and multiple ones of the cut-out holes are arranged in an array in the first bending region, the second bending region and the bidirectional bending region.

14. The flexible display module according to claim 1, wherein a depth of the cut-out hole is smaller than a thickness of the support layer.

15. The flexible display module according to claim 14, wherein the cut-out structure comprises a first cut-out structure disposed on one side of the support layer near the display panel, and a second cut-out structure disposed on one side of the support layer away from the display panel; wherein multiple ones of the cut-out holes of the first cut-out structure are not communicated from multiple ones of the cut-out holes of the second cut-out structure.

16. The flexible display module according to claim 1, wherein the flexible display module further comprises a backpanel and a heat dissipating film layer disposed between the display panel and the support layer, and a polarizer, a flexible substrate and a flexible cover plate disposed on one side of the display panel away from the support layer.

17. The flexible display module according to claim 1, wherein a material of the support layer is at least one of a manganese steel, a titanium alloy and a magnesium aluminum alloy.

18. A mobile terminal, comprising a main terminal body and a flexible display module, wherein the main terminal body and the flexible display module are combined into one unit;
wherein the flexible display module comprises a first bending region extending in a first direction, a second bending region extending in a second direction, and at least one bidirectional bending region located at an overlap position between the first bending region and the second bending region, wherein a predetermined included angle is formed between the first direction and the second direction;
wherein the flexible display module comprises a display panel and a support layer disposed away from a light emitting side of the display panel, the support layer comprises a cut-out structure, and the cut-out structure is at least disposed in the bidirectional bending region;
wherein the cut-out structure comprises multiple cut-out holes, the cut-out hole comprises a long axis and a short axis arranged in a cross manner, the long axis is disposed in parallel with one of the first direction and the second direction, and the short axis is disposed in parallel with the other one of the first direction and the second direction, the cut-out hole further comprises first arc parts disposed on two opposite ends in the extending direction along the short axis, second arc parts disposed on two opposite ends in the extending direction along the long axis, a first inclined straight line segment, a second inclined straight line segment and a third arc part;
wherein the first inclined straight line segment is connected to the second arc part and the third arc part, and the second inclined straight line segment is connected to the first arc part and the third arc part, the first arc part is convex in a direction toward a center of symmetry of the cut-out hole, and the second arc part is convex in a direction away from the center of symmetry of the cut-out hole, a radius of the first arc part is greater than a radius of the second arc part, and the radius of the second arc part is equal to a radius of the third arc part.

* * * * *